US006325900B1

(12) United States Patent
Komuro et al.

(10) Patent No.: US 6,325,900 B1
(45) Date of Patent: Dec. 4, 2001

(54) SPIN TUNNEL MAGNETO-RESISTANCE EFFECT TYPE MAGNETIC SENSOR AND PRODUCTION METHOD THEREOF

(75) Inventors: Matahiro Komuro; Yoshiaki Kawato, both of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/650,734

(22) Filed: Aug. 30, 2000

Related U.S. Application Data

(62) Division of application No. 09/302,228, filed on Apr. 29, 1999.

(30) Foreign Application Priority Data

Apr. 30, 1998  (JP) .................................................. 10-120504

(51) Int. Cl.[7] .............................. C23C 14/34; G11B 5/39; G11B 5/127
(52) U.S. Cl. .................................... 204/192.2; 29/603.14; 427/127
(58) Field of Search ...................... 204/192.2; 29/603.14, 29/603.15; 360/324.2, 314, 324.1; 427/502, 127, 131

(56) References Cited

U.S. PATENT DOCUMENTS 5,650,958  7/1997  Gallagher et al. ................... 365/173
5,729,410  3/1998  Fontana, Jr. et al. ................ 360/113

FOREIGN PATENT DOCUMENTS

10004227A  1/1998  (JP) .

*Primary Examiner*—Nam Nguyen
*Assistant Examiner*—Gregg Cantelmo
(74) *Attorney, Agent, or Firm*—Kenyon & Kenyon (57) ABSTRACT

A magnetic sensor utilizing a spin tunnel magneto-resistance effect (TMR), comprising a tunnel insulating film, a first magnetic layer formed on one of the planes of the tunnel insulating film, a second magnetic layer formed on the other plane of the tunnel insulating film, a third magnetic layer containing an anti-ferromagnetic substance for fixing magnetization of the second magnetic layer, a second insulating film formed on at least one of the first and third magnetic layers and having an opening in a predetermined region, a first electrode electrically connected to one of the first and third magnetic layers only in the opening of the second insulating film, and a second electrode for causing a current to flow between the first electrode and itself through at least the first and second magnetic layers and the first insulating layer.

1 Claim, 11 Drawing Sheets

SPIN TUNNEL MAGNETO-RESISTANCE EFFECT TYPE MAGNETIC SENSOR AND PRODUCTION METHOD THEREOF

This is a Divisional of U.S. patent application Ser. No. 09/302,228 filed Apr. 29, 1999.

BACKGROUND OF THE INVENTION

1. Field of the Invention

This invention relates generally to a magnetic sensor, and more particularly to a magnetic head and a magnetic memory used for computers and information processing units.

2. Description of the Related Art

Magnetic recording media have been predominantly magnetic disks and magnetic tapes. They are manufactured by forming a thin magnetic film on an Al substrate or a resin tape. A magnetic head utilizing an electromagnetic conversion operation is used in order to write and read magnetic information to and from these magnetic media. This magnetic head comprises a write portion for writing the magnetic information to the recording medium and a read portion for reading out the magnetic information from the recording medium. A so-called "induction type head", which comprises a coil and magnetic poles that wrap the coil from above and below and are electrically connected to the coil, is generally used for the write portion. Magneto-resistance effect (MR) heads have been proposed recently for the read portion so as to cope with the magnetic information having a high recording density. Among the MR heads, those heads which utilize the gigantic magneto-resistance effect (GMR) are well known nowadays.

Recently, a magnetic sensor using a ferromagnetic tunnel magneto-resistance effect (spin tunnel magneto-resistance effect: TMR) has been proposed for a magnetic memory as described in JP-A-10-4227. This TMR can obtain a greater resistance change ratio by causing a current to flow in a direction of film thickness of the magneto-resistance effect film than the conventional magneto-resistance effect devices such as the GMRs which cause a current to flow in a direction of the main plane of the magneto-resistance effect film.

According to the construction described in JP-A-10-4227, however, an upper electrode stack 30 comprising at least a free ferromagnetic layer 32 and a protective layer 34 must be formed inside a contact hole defined in an insulating layer 40. Therefore, production is difficult, and film quality and film thickness of each layer inside the contact hole are likely to fluctuate from a desired level.

SUMMARY OF THE INVENTION

In view of the problems described above, the present invention aims at providing a construction of a magnetic sensor using a spin tunnel magneto-resistance effect (TMR) which construction can be manufactured more easily than the prior art devices and can stably keep film quality and thickness at a desired level, and a method of producing the magnetic sensor.

To accomplish the object, a spin tunnel magneto-resistance effect magnetic sensor according to the present invention comprises a first insulating film which allows a current to tunnel and flow therethrough, a first magnetic layer formed on a first surface of the first insulating film and containing a ferromagnetic substance, a second magnetic layer formed on a second surface of the first insulating film and containing a ferromagnetic substance, a third magnetic layer formed on the second magnetic layer and containing an anti-ferromagnetic substance for fixing magnetization of the second magnetic layer, a second insulating film formed on at least one of the first and third magnetic layers and having an opening in a predetermined region, a first electrode electrically connected to one of the first and third magnetic layers only inside the opening of the second insulating film, and a second electrode for causing a current to flow between at least one of the first and second magnetic layer and the first electrode through the first insulating film.

A method of producing a spin tunnel magneto-resistance effect type magnetic sensor having a first magnetic layer containing a ferromagnetic substance, a second magnetic layer containing a ferromagnetic substance and a third magnetic layer containing an anti-ferromagnetic substance for fixing magnetization of the second magnetic layer according to the present invention comprises the steps of (a) forming the third magnetic layer over a substrate by sputtering, (b) forming the second magnetic layer on the third magnetic layer by sputtering, (c) processing at least the second and third magnetic layers into a first pattern, (d) forming a first insulating film, which allows an electric current to tunnel and flow there-through, on at least the first pattern, by sputtering, (e) forming a first magnetic layer on the first insulating film by sputtering, (f) processing at least the first magnetic layer and the first insulating film into a second pattern, (g) forming a second insulating film in at least a predetermined region of the second pattern, (h) forming an opening in a predetermined region of the second insulating film and (i) forming a first electrode, which is electrically connected to the first magnetic layer only inside the opening of the second insulating film, and forming a second electrode electrically connected to the second magnetic layer.

DETAILED DESCRIPTION OF THE EMBODIMENTS

Several embodiments of the present invention, wherein a magnetic sensor according to the present invention is applied to a reproducing magnetic head, will be explained initially.

The recording/reproducing head used in the first embodiment includes a reproducing TMR head utilizing a TMR (spin tunnel magneto-resistance effect) and an induction type recording thin film magnetic head. The reproducing TMR head is mounted onto a substrate, and the recording thin film magnetic head is mounted onto the TMR head.

This embodiment employs the construction for preventing a current flowing through a magneto-resistance effect film of the reproducing TMR head from leaking to a magnetic domain control layer, and improves detection efficiency of a resistance change ratio of the magneto-resistance effect film. Also, this embodiment reduces the width of the region, in which the current of the magneto-resistance effect film flows, by reducing the width of electrodes which are in contact with the magneto-resistance effect film, and reduces a track width, too. In this way, this embodiment provides a reproducing TMR head capable of coping with a magnetic recording medium having a higher recording density.

The construction of the reproducing TMR head according to the first embodiment will be explained more concretely with reference to FIGS. 1 and 2. The recording thin film magnetic head is disposed in superposition with the reproducing TMR head. The explanation of the construction of this thin film magnetic head will be omitted hereby because it is well known in the art.

Figure 1:
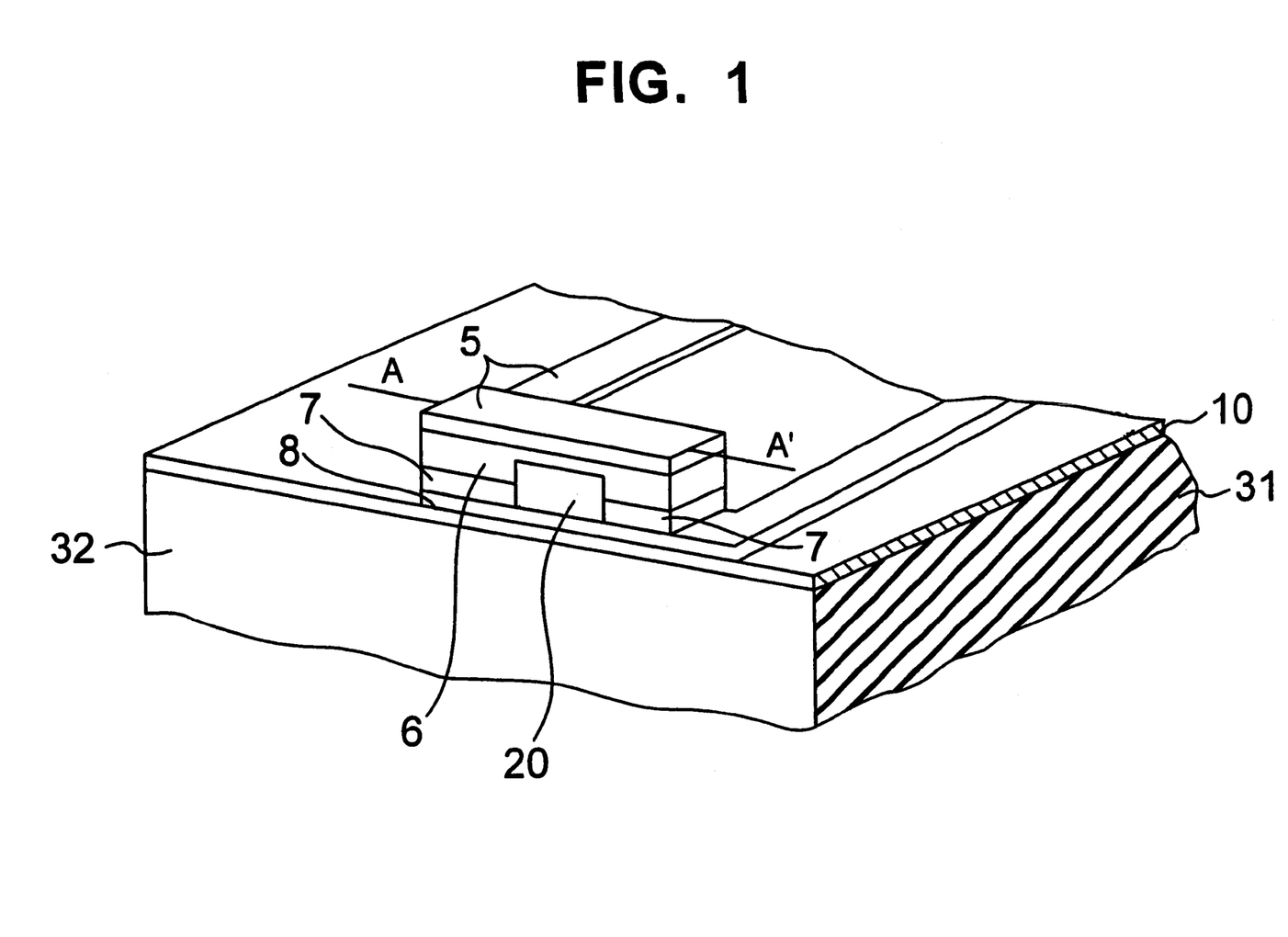
FIG. 1 is a perspective view showing a magnetic head according to a first embodiment of the present invention.

A lower shield film 10 is formed on a ceramic substrate 31 as shown in FIG. 1. An electrode film 8 patterned into a desired shape is disposed on the lower shield film 10. A magneto-resistance effect film 20 having a four-layered structure is disposed on and at a part of the electrode film 8. Magnetic domain control films 7 are arranged on both sides of the magneto-resistance effect film 20 and an insulating film 6 is disposed on the magneto-resistance effect film 20 and the magnetic domain control films 7 in such a fashion as to bury them. As shown in FIG. 2 which is a sectional view taken along a line A–A' of FIG. 1, a through-hole (opening) 21 is bored in the insulating film 6 at a position which is situated on the magneto-resistance effect film 20. An electrode film 5 is arranged on the insulating film 6 and keeps contact with the magneto-resistance effect film 20 at only the through-hole portion 21. Therefore, when a current is caused to flow from the electrode film 5 to the electrode film 8, this current flows from the portion, at which the electrode film 5 is in contact with the magneto-resistance effect film 20, to the magneto-resistance effect film 20 in the direction of film thickness. Consequently, the width of the region of the magneto-resistance effect film 20, in which the current flows, is limited substantially to the width of the through-hole 21 and this width practically serves as a track width. Incidentally, an upper shield film 9 (not shown in FIG. 1) is disposed on the electrode film 5. The shield films 9 and 10 are disposed in order to magnetically shield a leakage flux from the recording medium and to improve spatial resolution of the reproducing head.

The magneto-resistance effect film 20 has the four-layered structure comprising a ferromagnetic free layer 3, an electrical insulating layer 1, a ferromagnetic fixing layer 2 and an anti-ferromagnetic layer 4 that are laminated in order named. The free layer 3 and the fixing layer 2 are formed in such a fashion that their axes of easy magnetization are parallel. Magnetization of the fixing layer 2 is fixed to a predetermined direction due to its magnetic exchange/coupling with the anti-ferromagnetic film 4. When the reproducing TMR head opposes the magnetic recording medium, magnetization of the free layer 3 rotates in accordance with the direction of magnetization of the magnetic information recorded on the magnetic recording medium. Therefore, the direction of magnetization of the free layer 3 is parallel, or anti-parallel, to the direction of magnetization of the fixing layer 2. When the current is caused to flow through the magneto-resistance effect film 20 in the direction of film thickness through the electrode films 5 and 8, the current flows while tunneling through the insulating film 1. The electric resistance of the magneto-resistance effect film 20 changes depending on whether the directions of magnetization of the free layer 3 and the fixing layer 2 are parallel or anti-parallel to each other, due to the spin tunnel magneto-resistance effect (TMR). In other words, the tunnel current changes depending on the relative direction of the spin of magnetization in the free layer 3 and in the fixing layer 2. The recorded signal can be reproduced by detecting this change.

The magnetic domain control film 7 is a ferromagnetic film for applying a bias magnetic field to the free layer 3 in order to restrict the occurrence of the magnetic domain of the free layer 3. This embodiment employs the positional relationship such that the upper surface of each magnetic domain control film 7 is always positioned below the upper surface of the insulating layer 1 (on the side of the substrate 31 shown in FIG. 1) and that the fixing layer 2 and each magnetic domain control film 7 are out of mutual contact. Because the magnetic domain control film 7 has a low resistivity, a part of the current flowing from the electrode film 5 to the electrode film 8 will leak from the fixing layer 2 to the electrode film 8 through the magnetic domain control film 7 without tunneling through the insulating film 1 if the magnetic domain control film 7 keeps contact with the fixing layer 2. The construction shown in FIG. 2 can prevent the leak of the current because the fixing layer 2 and the magnetic domain control films 7 are out of mutual contact.

Next, the material of each part will be explained. The lower shield film 10 is made of Co type amorphous alloys such as CoNbZr, NiFe alloys, FeAlSi alloys or CoNiFe alloys. The film thickness is from 1 to 5 $\mu$m. The upper shield film 9 is made of NiFe alloys or CoNiFe alloys and the absolute value of its magneto-restriction constant is not greater than $5 \times 10^{-6}$. The upper shield film 9 can be used also as the lower core of the recording thin film magnetic head and in this case, the upper shield film 9 may be a multi-layered film comprising a ferromagnetic layer and an oxide, or a ferromagnetic alloy film that contains a metalloid such as B or P. In addition, the upper shield film 9 preferably has a high resistivity (at least 40 $\mu\Omega\cdot$cm) so as to improve high frequency characteristics of the recording thin film magnetic head.

Since the electrode film 8 serves as the base film of the magneto-resistance effect film 20, it must be an electrode film which stabilizes the characteristics of the magneto-resistance effect film 20 and provides a high resistance change amount. More concretely, the surface of the electrode film 8 is preferably flat and clean and when a high current density is taken into consideration, the electrode film 8 is preferably made of a material having a high melting point. Therefore, the electrode film 8 is formed by sputtering or vacuum deposition of those elements, as low resistivity materials, which have a high melting point but exhibit low exothermy, such as Ta, Nb, Ru, Mo, Pt, Ir, etc, alloys containing these elements, such as Ta alloys, TaW alloys, or alloys of W, Cu, Al, and so forth. The thickness of the electrode film 8 is from 3 to 30 nm and is changed in accordance with the spacing between the shield film 10 and the shield film 9. The smaller the thickness of the electrode film 8, the smaller becomes the spacing between the shield film 10 and the shield film 9, and the higher becomes resolution of the reproducing TMR head. This electrode film 8 may be a multi-layered film (e.g. a multi-layered structure of Ta layer/Pt layer/Ta layer or Ta layer/Cu layer/Ta layer).

The electrode film 5 may be made of the same material as that of the electrode film 8.

The free layer 3 of the magneto-resistance effect film 20 may have a single layered structure made of a ferromagnetic material such as a NiFe alloy, a Co alloy, a FeCo alloy or a CoNiFe alloy, or a multi-layered structure containing a ferromagnetic layer for preventing diffusion on the interface or restricting anisotropic dispersion. Examples of the multi-layered structure include a structure of Co layer/NiFe layer/Co layer and a multi-layered structure of a Co layer/NiFe alloy layer/CoFe layer. Which material is used for the free layer 3 and whether the free layer 3 uses the single layer structure or the multi-layered structure are determined also by the combination with the electrode film 8 as the base. The fixing layer 2 can be made of Co or a Co alloy, or may be made of the same material or may have the same structure, as that of the free layer 3. The fixing layer 2 may also comprise a multi-layered structure of a magnetic layer(s) and a nonmagnetic layer(s). For example, it may comprise a multi-layered structure of ferromagnetic layer/nonmagnetic layer/Co layer such as Co layer/Ru layer/Co layer. The anti-ferromagnetic layer 4 may be made of IrMn, CrMn type alloys (such as CrMnPt, CrMnRu and CrMnRh), MnRh alloys, MnPt alloys, MnPtPd alloys, NiMn alloys, NiMnPd alloys, MnRhRu alloys, NiO, CoO alloys, $Fe_2O_3$ and $Fe_3O_4$ alloys and a CrAl alloy. Alternatively, the anti-ferromagnetic film 4 may comprise a multi-layered film made of the combination of these materials. The film thickness is 3 to 10 nm for the free layer 3, 1 to 10 nm for the fixing layer 2 and 2 to 25 nm for the anti-ferromagnetic film 4. These films can be formed by sputtering.

The insulating layer 1 of the magneto-resistance effect film 20 is made of any of an oxide, a nitride, a fluoride and a boride, or a material containing any of them. For example, it is made of $Al_2O_3$, $SiO_2$, $Ta_2O_5$, $TiO_2$ or an oxide having a perovskite structure, or a mixed phase of any of these oxides, to which nitrogen is partly added, and a nitride. The insulating layer 1 may be a multi-layered film. The thickness of the insulating layer 1 is extremely mall, for example, 0.2 to 3 nm.

On the other hand, the insulating film 6 is made $Al_2O_3$ or $SiO_2$. An insulating film having a high dielectric withstand voltage can be obtained by employing a multi-layered structure of a non-magnetic metal film/oxide film/non-magnetic metal film or a ferromagnetic metal film/oxide film/ferromagnetic metal film. For example, the insulating film 6 may have a multi-layered structure of an Al film/ $Al_2O_3$ film/Al film and a multi-layered structure of a Ni film/NiO film/Ni film or a Co film/Coo film/Co film. The insulating film 6 can be made of an oxide containing at least one of Ti, Sr and Ba. Among them, the film containing Ti, Sr or Ba becomes a film containing the perovskite structure and can improve the dielectric withstand voltage.

The magnetic domain control film 7 comprises a Co type hard ferromagnetic film. A film of Cr, Nb or Ta as a non-magnetic metal may be disposed as the base of the magnetic domain control film 7.

Incidentally, the width of the through-hole 21 of the insulating film 21 is preferably as small as possible because it determines the track width. The production process for this purpose may be as follows, for example. The lower shield film 10 and the magneto-resistance effect film 20 are formed first on the substrate 31. After the magneto-resistance effect film 20 is etched by milling method, the magnetic domain control films 7 are then formed. The magnetic domain control films 7 formed on the magneto-resistance effect film 20 are removed by lift-off. The insulating film 6 is formed. It is formed by sputtering or CVD. Next, this insulating film 6 is etched by RIE (Reactive Ion Etching) and the through-hole 21 is formed. The etching condition at this time is of importance. Namely, a $CHF_3$ or chlorine gas is used for etching so that the width of the through-hole 21 becomes small. After the electrode film 5 is formed, the through-hole 21 is filled with this electrode film 5. The surface of the electrode film 5 is processed into a flat surface by etching or CMP (Chemical Mechanical Polishing) and the upper shield film 9 is formed by sputtering or plating on this flat electrode film 5. Thereafter, the recording thin film magnetic head is formed on the upper shield film 9.

Next, the explanation will be given on the reproducing operation of the magnetic information of the recording medium by using the reproducing TMR head having the construction shown in FIGS. 1 and 2. First, the float-up surface 32 of the magneto-resistance effect head is caused to float above the recording medium so that the float-up surface 32 and the recording medium oppose each other with a small spacing between them. The direction of magnetization of the fixing layer 2 does not change because it is fixed by magnetic exchange/coupling with the anti-ferromagnetic film 4. On the other hand, magnetization of the free layer 3 rotates with the direction of magnetization of the magnetic information of the recording medium. In consequence, the direction of magnetization of the fixing layer 2 and the direction of magnetization of the free layer 2 are either parallel or anti-parallel to each other depending on the magnetic information of the recording medium. When the current is caused to flow between the electrode films 5 and 8, the current flows in the direction of film thickness while tunneling through the insulating layer 1 of the magneto-resistance effect film 20. The electric resistance of the magneto-resistance effect film 20 at this time varies depending on whether the direction of magnetization of the fixing layer 2 and that of the free layer 3 are parallel or anti-parallel, due to the spin tunnel magneto-resistance effect. This means that the magnetic information of the recording medium can be reproduced by detecting the current between the electrode films 5 and 8 and by detecting the resistance change ratio. Incidentally, when the magnetic information is recorded to the recording medium, the information is recorded by the recording thin film magnetic head mounted onto the reproducing TMR head by floating the float-up surface 32 over the recording medium.

In the reproducing TMR head of the first embodiment described above, the width of the electrode film 5, which is in contact with the magneto-resistance effect film 20, is decreased by the insulating film 6 and the track width is set to a width smaller than that of the magneto-resistance effect film 20. Therefore, the track width can be narrowed easily without reducing the width of the magneto-resistance effect film 20 and the recording density of the magnetic disk of the magnetic recording/reproducing apparatus can be increased.

Since the magnetic domain control film 7 and the fixing layer 2 have the positional relationship such that they are out of mutual contact, it becomes possible to prevent the current from leaking from the fixing layer 2 to the electrode film 8 through the magnetic domain control film 7. Since the current flowing through the magneto-resistance effect film 20 in the direction of film thickness can be increased in this way, the quantity of the current that contributes to the detection of the resistance change ratio of the magneto-resistance effect film 20 due to the spin tunnel magneto-resistance effect increases, and detection efficiency of the resistance change ratio can be improved.

As described above, the first embodiment can provide a reproducing TMR head which can cope with a high recording density and moreover, has high detection efficiency of the resistance change ratio.

Next, a reproducing TMR head according to the second embodiment will be explained with reference to FIG. 3.

Figure 2:
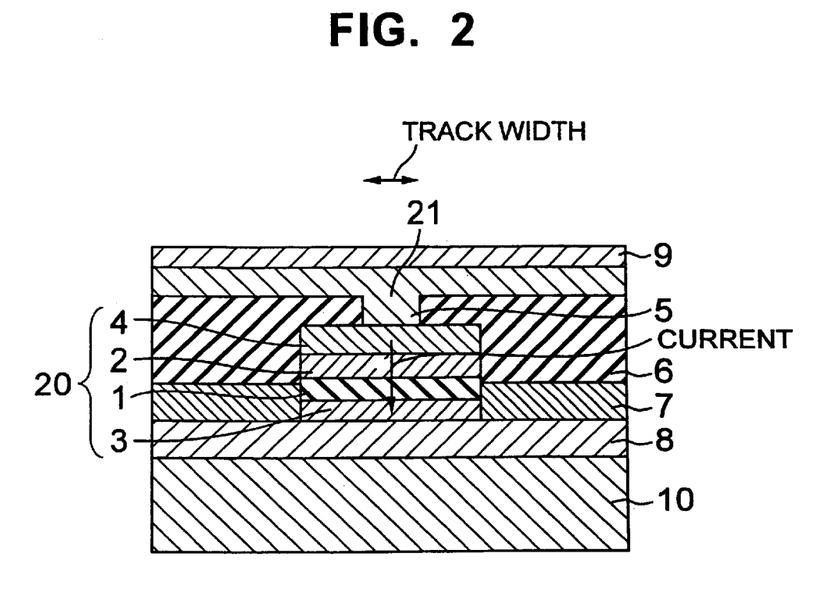
FIG. 2 is a sectional view showing a part of the magnetic head according to the first embodiment of the present invention.
Figure 3:
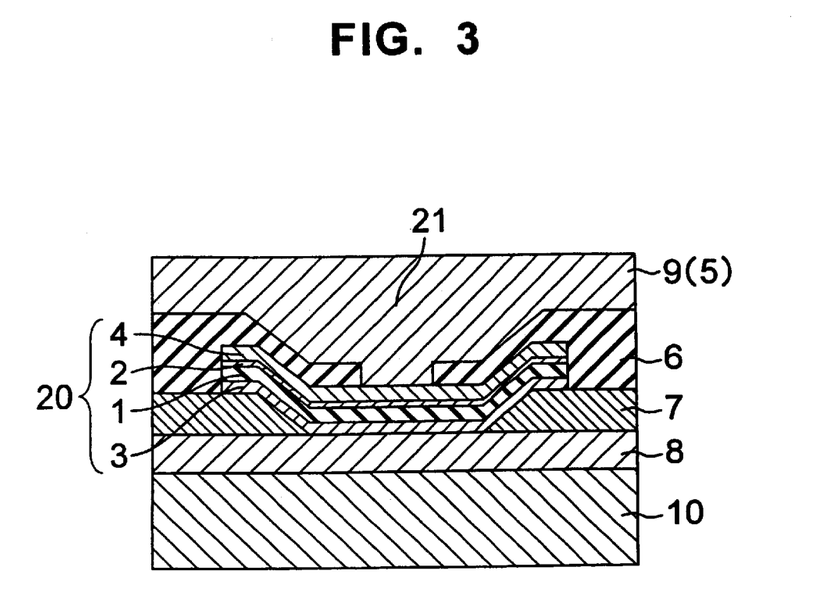
FIG. 3 is a sectional view showing a part of a magnetic head according to a second embodiment of the present invention.

In FIG. 3, like reference numerals are used to identify like layers and like films having the same functions as in FIG. 2. A large difference of the reproducing TMR head shown in FIG. 3 from the reproducing head of FIG. 2 resides in that both end portions of the magneto-resistance effect film 20 are so arranged as to hang on the magnetic domain control films 7. According to this construction, the insulating layer 1 always exists between the free layer 2 and the magnetic domain control films 7, so that the leakage current from the free layer 2 to the magnetic domain control films 7 can be prevented more effectively. Therefore, the magnetic domain control films 7 can be composed of a film having a low resistivity (CoCr alloy film). In the construction shown in FIG. 3, the upper shield film 9 is used also as the upper electrode film 5, and the production process can be simplified eventually.

When the insulating film 6 is made of $SiO_2$ and the through-hole 21 is formed by RIE using $CHF_3$ as the etching gas in the construction shown in FIG. 3, the width (track width) of the through-hole 21 that can be formed is from 0.2 to 0.3 $\mu$m. This track width can achieve a high recording density of 20 $Gb/in^2$ or more.

Next, a reproducing TMR head according to the third embodiment will be explained with reference to FIG. 4.

Figure 4:
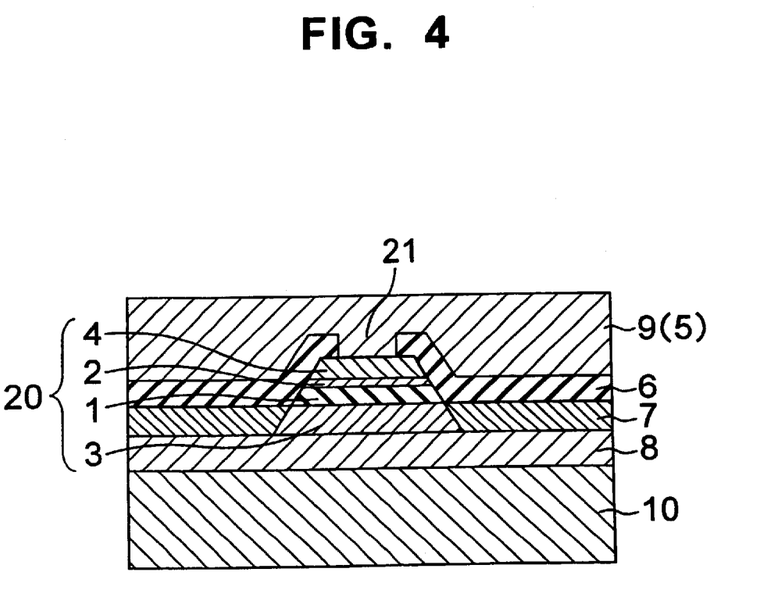
FIG. 4 is a sectional view showing a part of a magnetic head according to a third embodiment of the present invention.

In FIG. 4, like reference numerals are used to identify like layers and like films having the same functions as the layers and the films shown in FIG. 2. As shown in FIG. 4, the magneto-resistance effect film 20 is tapered on the side surface at a taper angle of 50 to 80 degrees. This taper is generated by the incidence conditions of the ions for milling the magneto-resistance effect film 20. The lower shield film 10 is a Co type amorphous alloy film or a FeAlSi alloy film. The electrode film 8 is made of a Ta alloy, a TaW alloy, alloys of Nb, Mo, W, Cu and Al, or alloys of precious metals such as Ru, Pt, etc. The electrode film 8 comprises a multi-layered film (e.g. Ta layer/Pt layer/Ta layer or Ta layer/Cu layer/Ta layer). The free layer 2 is a multi-layered film in order to prevent diffusion on the interface or to restrict anisotropic dispersion. It has, for example, a multi-layered structure of a Co layer/NiFe layer/Co layer.

Next, a production process of the reproducing head shown in FIG. 4 will be explained with reference to FIGS. 11A to 11G.

Figure 11A:
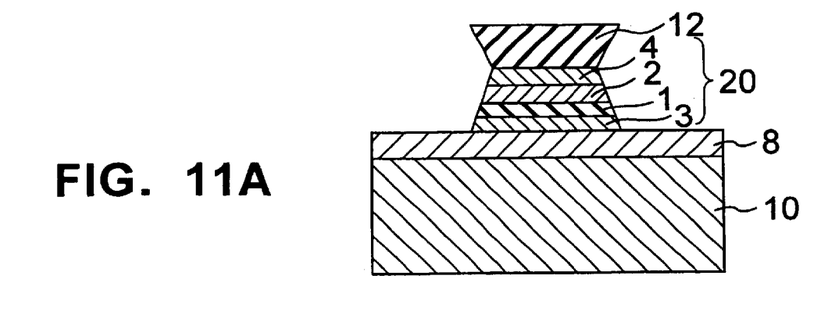
FIGS. 11A to 11G are sectional views each showing a production step of the magnetic head shown in FIG. 4.
Figure 11B:
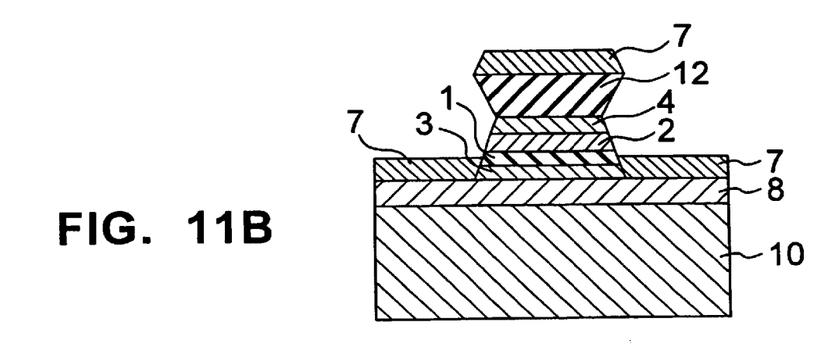
Figure 11C:
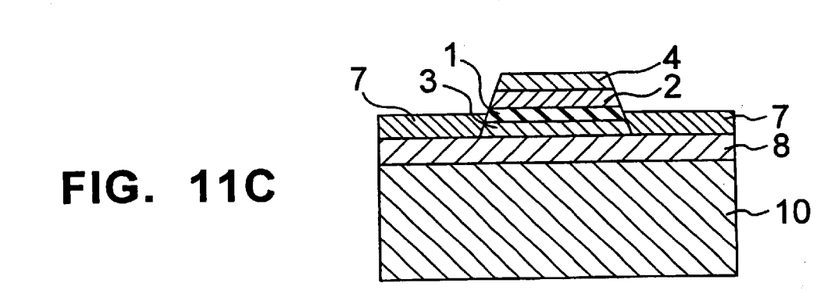
Figure 11D:
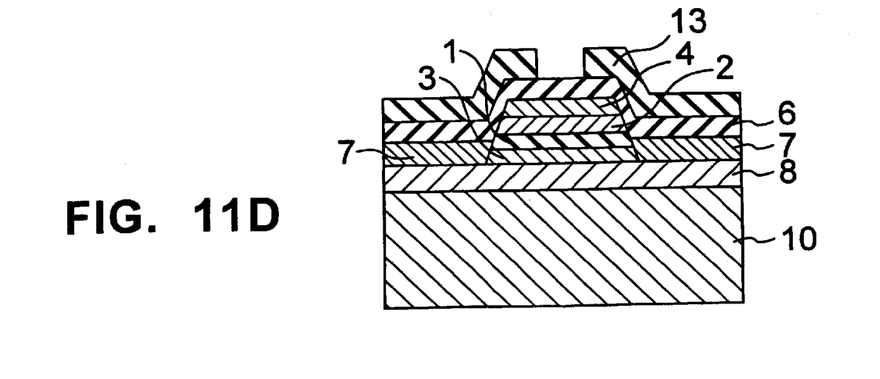
Figure 11E:
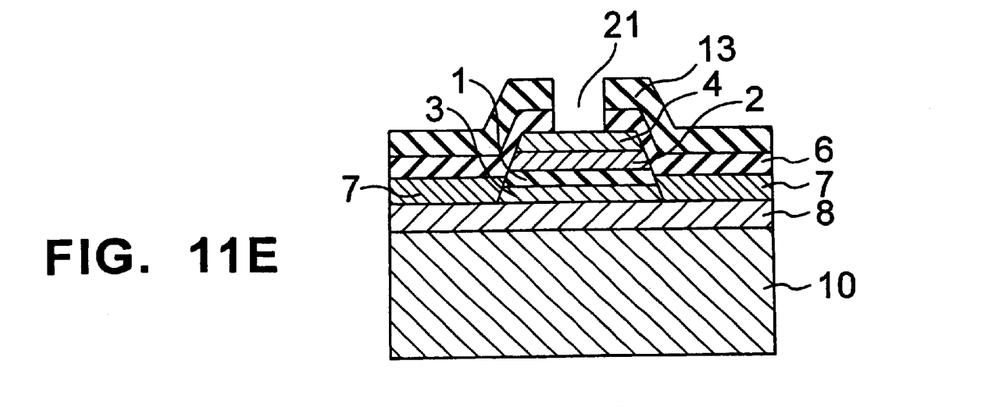
Figure 11F:
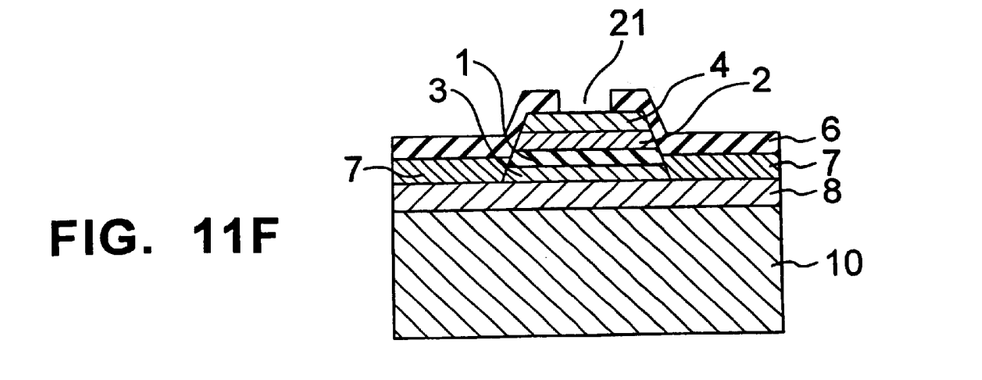
Figure 11G:
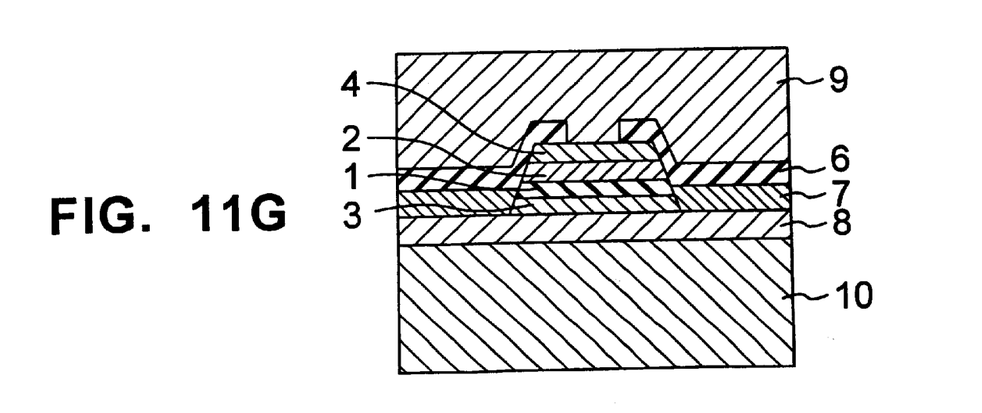

To begin with, the lower shield film 10 is formed on a substrate (similar to the substrate 31 shown in FIG. 1) by sputtering or plating, and then the electrode film 8 is formed by vacuum deposition. After the surface of the electrode film 8 is subjected to ion cleaning, the free layer 3, the insulating layer 1, the fixing layer 2 and the anti-ferromagnetic film 4 of the magneto-resistance effect film 20 are formed in order. These four layers of the magneto-resistance effect film 20 are processed by ion milling. After the resist film 12 having the shape shown in FIG. 11A is formed on the magneto-resistance effect film 20 which is so processed, the magnetic domain control films 7 are formed (FIG. 11B), the resist film 12 is dissolved, and the magnetic domain control films 7 on the magneto-resistance effect film 20 are lifted off (FIG. 11C). The insulating film 6 is then formed, and then the resist film 13 is formed on this insulating film 6 and is patterned (FIG. 11D) Next, the insulating film 6 is processed by IRE using the resist film 13 as a mask. This process step forms the through-hole 21 (FIG. 11C) Incidentally, a stopper film may be formed in advance between the anti-ferromagnetic film 4 and the insulating film 6 in order to prevent the anti-ferromagnetic film 4 from being damaged by RIE. The resist film 13 is removed (FIG. 11F) and the upper shield film 9 is formed on the insulating film 6 (FIG. 11G). In this way, the reproducing TMR head shown in FIG. 4 can be produced.

Incidentally, the upper shield film 9 shown in FIGS. 3 and 4 serves also as the electrode film 5 but in this case, the upper shield film 9 is not smooth and flat in comparison with the construction of FIG. 1 because the upper shield film 9 has the shape that profiles the insulating film 6 and the magneto-resistance effect film 20. Therefore, magnetic walls are likely to be defined on the upper shield film 9 in the proximity of the through-hole 21. To prevent the formation of the magnetic walls, a non-magnetic film may be formed in the proximity of the through-hole 21 as a multi-layered shield film 9. It has been found that the formation of the magnetic walls can be prevented by forming, for example, a shield film 9 having a multi-layered structure comprising a NiFe layer/$Al_2O_3$ layer/NiFe layer, and the shield film 9 contributes to the prevention of fluctuation of the output of the reproducing TMR head and the occurrence of the noise.

Next, a reproducing TMR head according to the fourth embodiment will be explained with reference to FIG. 5.

Figure 5:
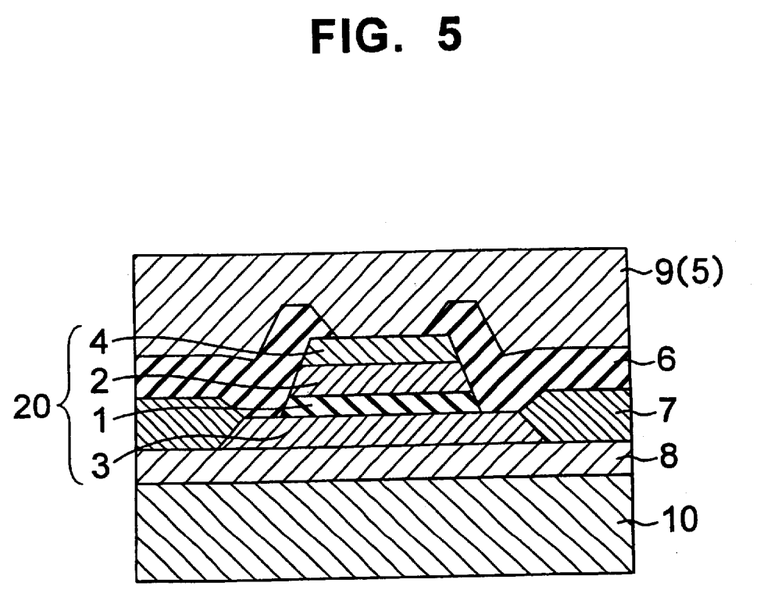
FIG. 5 is a sectional view showing a part of a magnetic head according to a fourth embodiment of the present invention.

In FIG. 5, like reference numerals are used to identify like layers and films having the same functions as those shown in FIG. 2. In the reproducing TMR head shown in FIG. 5, the magneto-resistance effect film 20 is tapered, the free layer 3 inside the magneto-resistance effect film 20 has a greater width than the other layers 1, 2 and 4, and the insulating film 6 is so arranged as to be in contact with both ends of the upper surface of the free layer 3. In comparison with the construction shown in FIG. 4, the construction of FIG. 5 completely isolates the magnetic domain control films 7 and the fixing layer 2 by the insulating film 6, and can prevent with high reliability the leak of the current from the fixing layer 2 to the magnetic domain control films 7.

When the reproducing TMR head shown in FIG. 5 is produced, only the free layer 3 of the magneto-resistance effect film 20 is first formed and then milling is effected once so as to process only the free layer 3. Thereafter, the three layers of the insulating layer 3, the fixing layer 2 and the anti-ferromagnetic film 4 are formed and milling is carried out once again to process these three layers. Alternatively, the four layers of the magneto-resistance effect film 20 are formed all at once, the three layers of the insulating layer 3, the fixing layer 2 and the anti-ferromagnetic film 4 are then etched by milling and etching is stopped on the free layer 3. In either case, the shape shown in FIG. 5 can be accomplished. Other production steps and the materials may be the same as those of the embodiment shown in FIG. 4.

Next, FIGS. 6 to 9 show the fifth to eighth embodiments wherein a high resistivity film 11 is interposed between the magnetic domain control films 7 and the magneto-resistance effect film. This high resistivity film 11 is to prevent the current flowing through the magneto-resistance effect film 20 in the direction of film thickness from leaking to the magnetic domain control films 7, and is made of an insulating material or a semiconductor.

Figure 6:
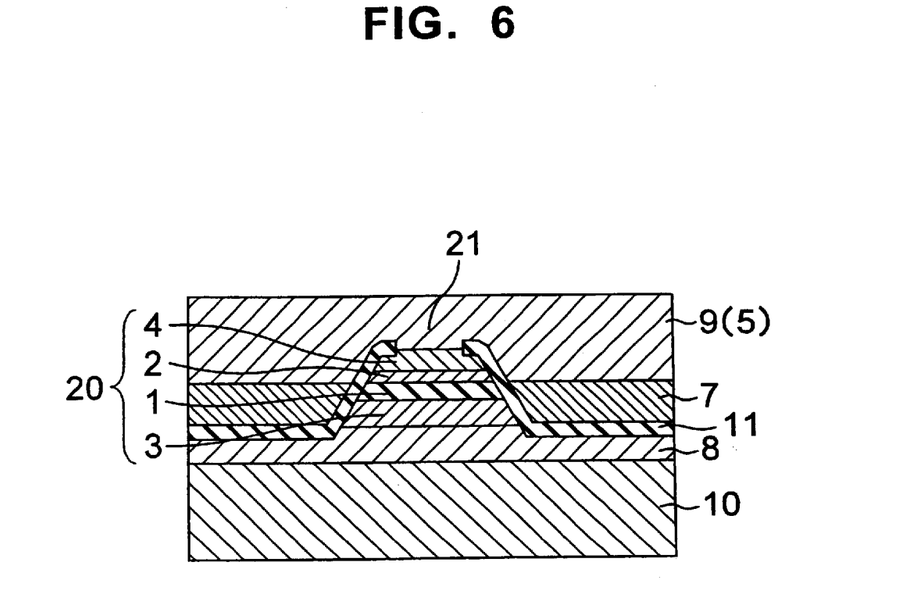
FIG. 6 is a sectional view showing a part of a magnetic head according to a fifth embodiment of the present invention.

The construction of the reproducing TMR shown in FIG. 6 seems analogous to the construction shown in FIG. 4, but it is not equipped with the insulating film 6 but is equipped instead with the high resistivity film 11. The high resistivity film 11 is disposed in such a fashion as to cover the side surface of the magneto-resistance effect film 20 and the magnetic domain control layers 7 are disposed outside the high resistivity film 11. The through-hole is bored in the high resistivity film 11 in the same way as in the case of the insulating film 6 shown in FIG. 4 and the width of this through-hole determines the width of the electrode film 5 (serving also as the upper shield film 9) which is in contact with the anti-ferromagnetic film 4, that is, the track width.

The procedure for producing the reproducing TMR head shown in FIG. 6 will be explained briefly. First, the lower shield film 10, the electrode film 8 and the magneto-resistance effect film 20 are formed serially on the substrate 31 and then the magneto-resistance effect film 20 is processed by miling. The high resistivity film 11 is formed on the magneto-resistance effect film 20 by sputtering $SiO_2$ or $Al_2O_3$ to a film thickness of 5 to 10 nm. The adhering condition of the film is adjusted by changing the sputtering condition (particularly, the distance between the substrate and the target) and the high resistivity film 11 having the thickness shown in FIG. 6 is formed. Next, the magnetic domain control films 7 are formed. The thickness of the magnetic domain control films 7 is 5 to 20 nm. The magnetic domain control films 7 on the magneto-resistance effect film 20 are removed by lift-off in the same way as in FIGS. 11B and 11C. The through-hole is formed in the high resistivity film 11 by the same means as the one shown in FIGS. 11D to 11F. Thereafter the upper shield film 9 (serving also as the electrode film 5) is formed.

Figure 7:
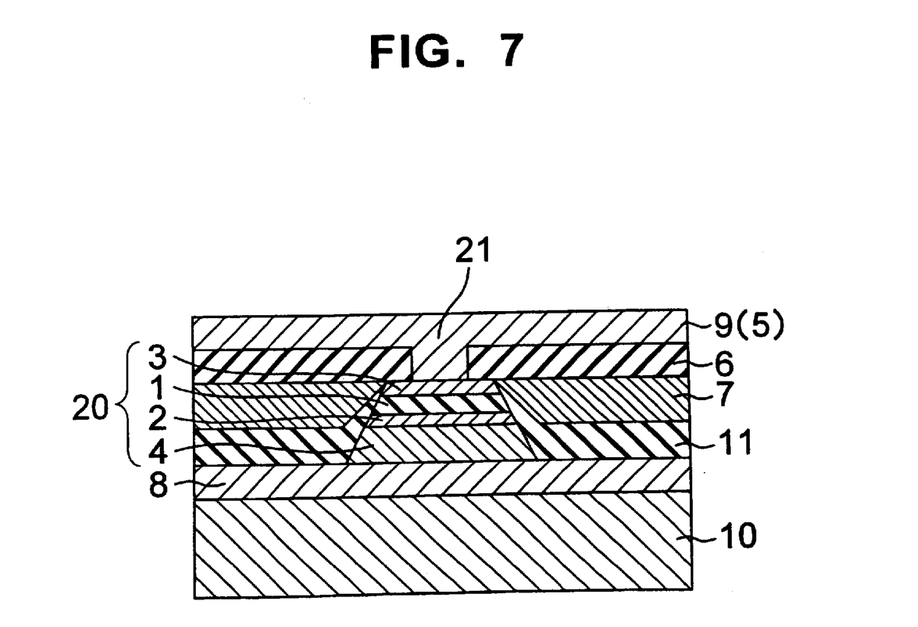
FIG. 7 is a sectional view showing a part of a magnetic head according to a sixth embodiment of the present invention.
Figure 8:
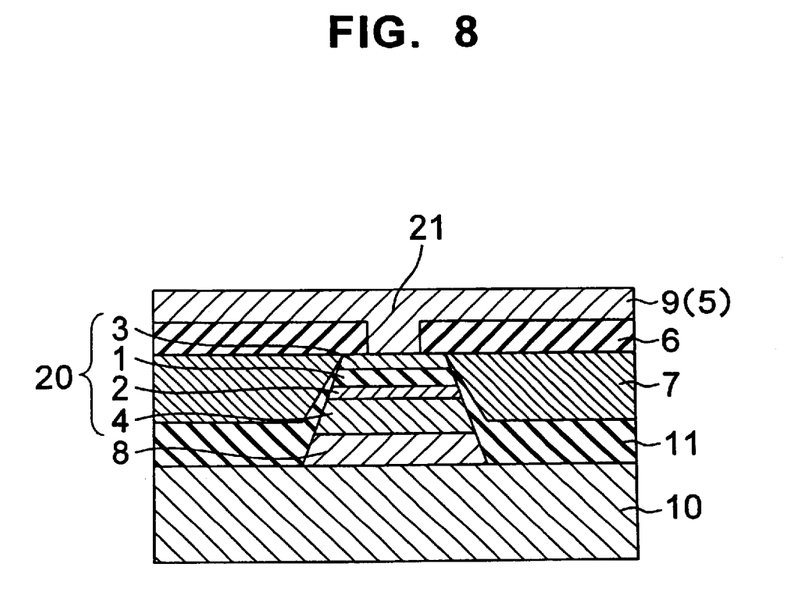
FIG. 8 is a sectional view showing a part of a magnetic head according to a seventh embodiment of the present invention.
Figure 9:
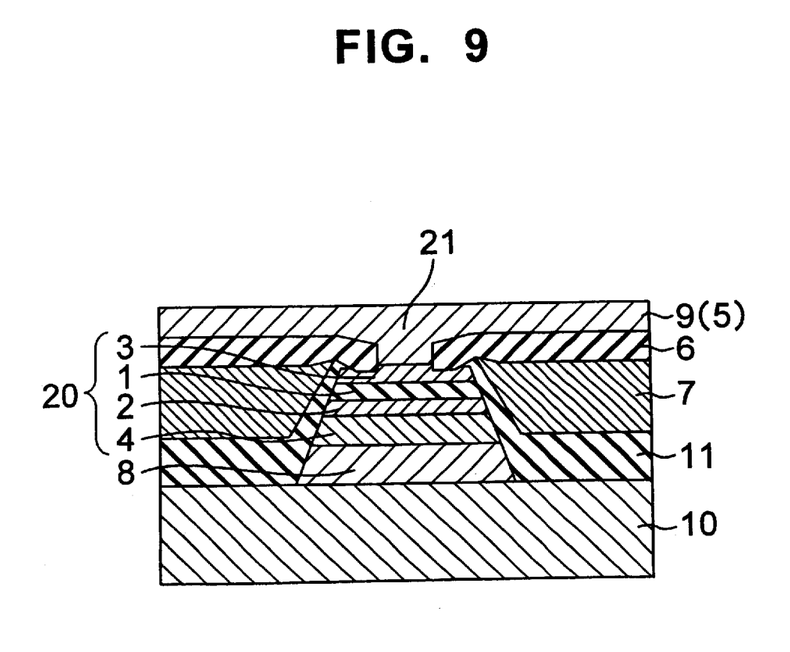
FIG. 9 is a sectional view showing a part of a magnetic head according to an eighth embodiment of the present invention.

On the other hand, each of the constructions shown in FIGS. 7 to 9 is equipped with both the insulating film 6 and the high resistivity film 11. The film thickness of the high resistivity film 11 is large at the upper portion of the side surfaces of the magneto-resistance effect film 20 but is uniform at other flat portions. The upper surface of each magnetic domain control film is flat and is in conformity with the upper surface of the magneto-resistance effect film 20. Therefore, the insulating film 6 has a uniform thickness. Further, the order of each layer of the magneto-resistance effect film 20 is exactly opposite to the order of the constructions shown in FIGS. 2 to 6. In other words, the anti-ferromagnetic film 4, the fixing layer 2, the insulating layer 1 and the free layer 3 are disposed in order named from the electrode film (8) side. The track width is determined by the spacing of the through-hole of the insulating film 6 in entirely the same way as in the constructions shown in FIGS. 2 to 5.

In the construction shown in FIG. 8, the lower electrode film 8 (serving also as the base film of the magneto-resistance effect film 20), too, is processed by milling and the high resistivity film 11 is formed on the side surface portion of the electrode film 8, too. In the construction shown in FIG. 9, the high resistivity film 11 extends up to both end portions of the upper surface of the free layer 3.

The production process of the reproducing TMR head having the construction shown in FIG. 8 will be explained with reference to FIGS. 12A to 12G.

Figure 12A:
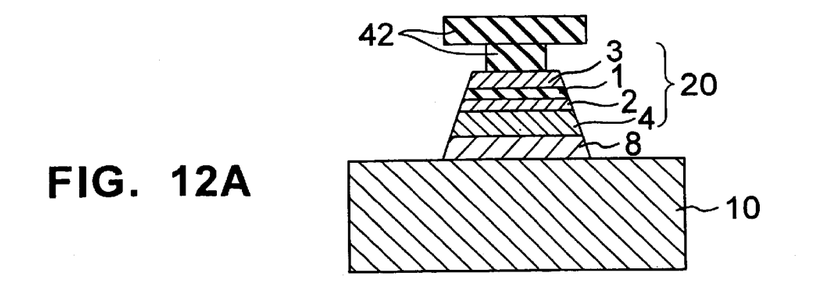
FIGS. 12A to 12G are sectional views each showing a production step of the magnetic head shown in FIG. 8.
Figure 12B:
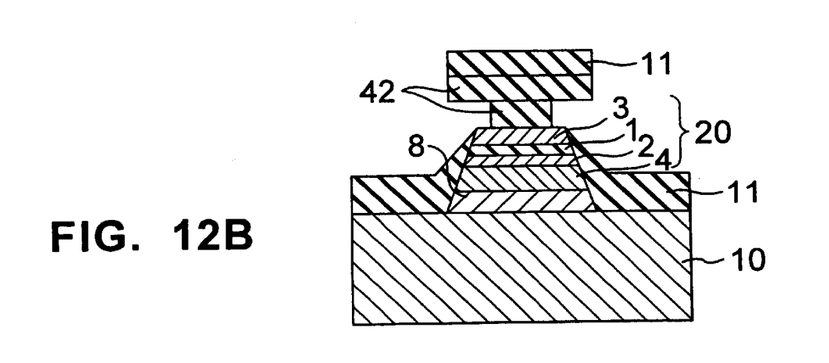
Figure 12C:
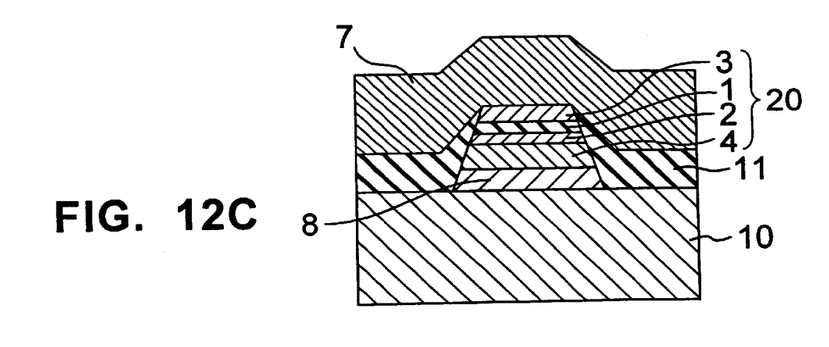
Figure 12D:
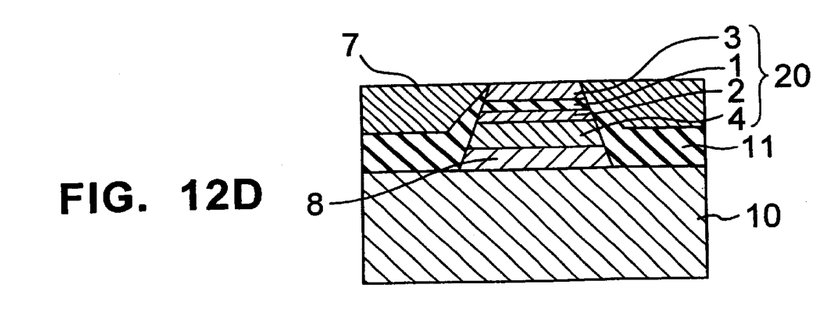
Figure 12E:
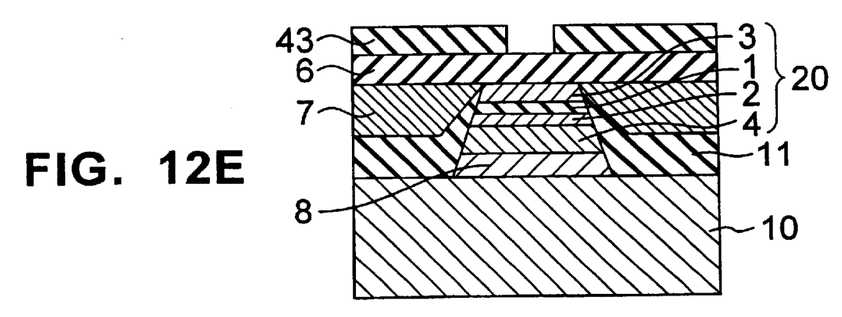
Figure 12F:
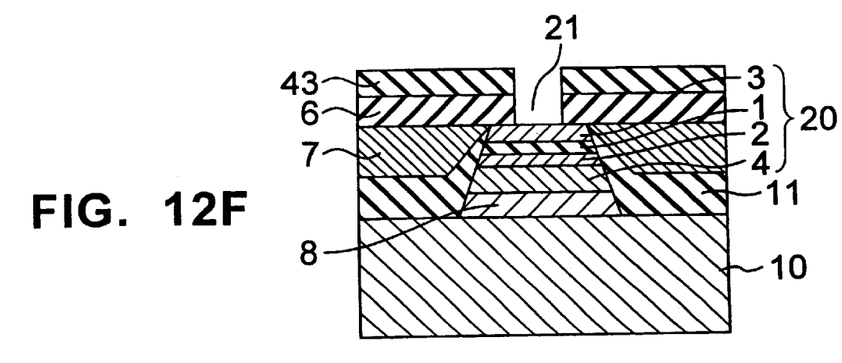
Figure 12G:
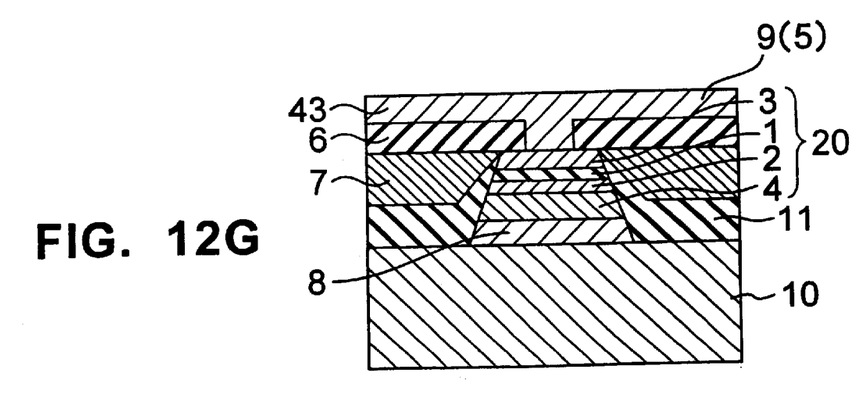

Initially, the lower shield film 10 is formed by sputtering or plating on the substrate (similar to the substrate 31 shown in FIG. 1) and the electrode film 8 is formed by vacuum deposition. After the surface of the electrode film 8 is cleaned by ion cleaning, the anti-ferromagnetic film 4, the fixing layer 2, the insulating layer 1 and the free layer 3 of the magneto-resistance effect film 20 are serially formed. These four layers of the magneto-resistance effect film 20 and the electrode film 8 are then processed by ion milling. A resist film 42 having the shape of two stages as shown in FIG. 12A is formed on the magneto-resistance effect film 20 so processed. The high resistivity film 11 is formed on this resist film 42 (FIG. 12B). The resist film 42 is dissolved and the high resistivity film 11 on the magneto-resistance effect film 11 is lifted off. The magnetic domain control films 7 are formed next. The upper surface of the magnetic domain control films 7 is polished to a flat surface by CMP (Chemical Mechanical Polishing) (FIG. 12D). The insulating film 6 and the resist film 43 are serially formed on this control film 7 and the resist film 43 is patterned (FIG. 12E). The insulating film 6 is processed by RIE using this resist film 43 as the mask. In this way the through-hole 21 can be formed (FIG. 12F). After the resist film 43 is removed, the upper shield film 9 (which serves also as the electrode film 5) is formed on the insulating film 6 (FIG. 12G). As a result, the reproducing TMR head shown in FIG. 8 can be fabricated.

In the reproducing TMR head having each of the constructions shown in FIGS. 6 to 9, the high resistivity film 11 covers the entire side surface of the magneto-resistance effect film 20 and electrically isolates the magnetic domain control films 7 from the magneto-resistance effect film 20. Therefore, the leakage current flowing from the fixing layer 2 to the electrode film 8 through the magnetic domain control film 7 does not occur, and the current flowing through the magneto-resistance effect film 20 in the direction of film thickness can be increased. In consequence, detection efficiency of the resistance change ratio of the magneto-resistance effect film 20 due to the spin tunnel magneto-resistance effect can be improved.

The constructions shown in FIGS. 6 to 9 reduce the width of the electrode film 5, which is in contact with the magneto-resistance effect film 20, to a smaller width than the width of the insulating film 6 and the high resistivity film 11 so that the track width becomes smaller than the width of the magneto-resistance effect film 20, in the same way as the constructions shown in FIGS. 2 to 4. Therefore, the track width can be easily made narrower without reducing the width of the magneto-resistance effect film 20 and the recording density of the magnetic disk of the magnetic recording/reproducing apparatus can be increased.

Further, in the constructions shown in FIGS. 7 to 9, the upper surface of the magnetic domain control films 7 is brought into conformity with the upper surface of the magneto-resistance effect film 20 and is rendered flat. Therefore, the upper shield film 9 (serving also as the electrode film 5) can keep a uniform thickness with the exception of the portion of the through-hole 21. For this reason, the magnetic wall does not easily develop in the upper shield film 9 and performance of the upper shield film 9 can be improved.

Next, the overall construction and operation of a magnetic recording/reproducing apparatus using the reproducing TMR head of each embodiment of the present invention described above will be explained with reference to FIG. 10.

A recording/reproducing head 210 includes the reproducing TMR head in any of the constructions shown in FIGS. 2 to 9 and a recording thin film magnetic head mounted onto the reproducing TMR head. The recording/reproducing head 210 is supported at the distal end of a spring 211 with its float-up surface facing down. The spring is fitted to a head positioning mechanism 320. The head positioning mechanism 320 positions the recording/reproducing head 210 onto a recording medium (hard disk) 110. The recording medium 110 is driven for rotation by a spindle motor 310. When recording is made, the inputted recording data is encoded by an encoder 335 and a recording current is supplied by a recording amplifier 336 to the recording thin film magnetic head. When reproduction is made, on the other hand, the current flowing between the electrode films 5 and 8 of the reproducing TMR head is processed by a signal processing system 330 and the magnetic information of the recording medium 110 is reproduced. More concretely, the current flowing between the electrode films 5 and 8 is amplified by a pre-amplifier 331 and the data is reproduced by a data reproducing circuit 332 and is decoded by a decoder 333. A servo detector 334 controls tracking of the recording/ reproducing head 210 by using the output signal of the pre-amplifier 331. A controller 340 controls the signal processing operations described above.

Figure 10:
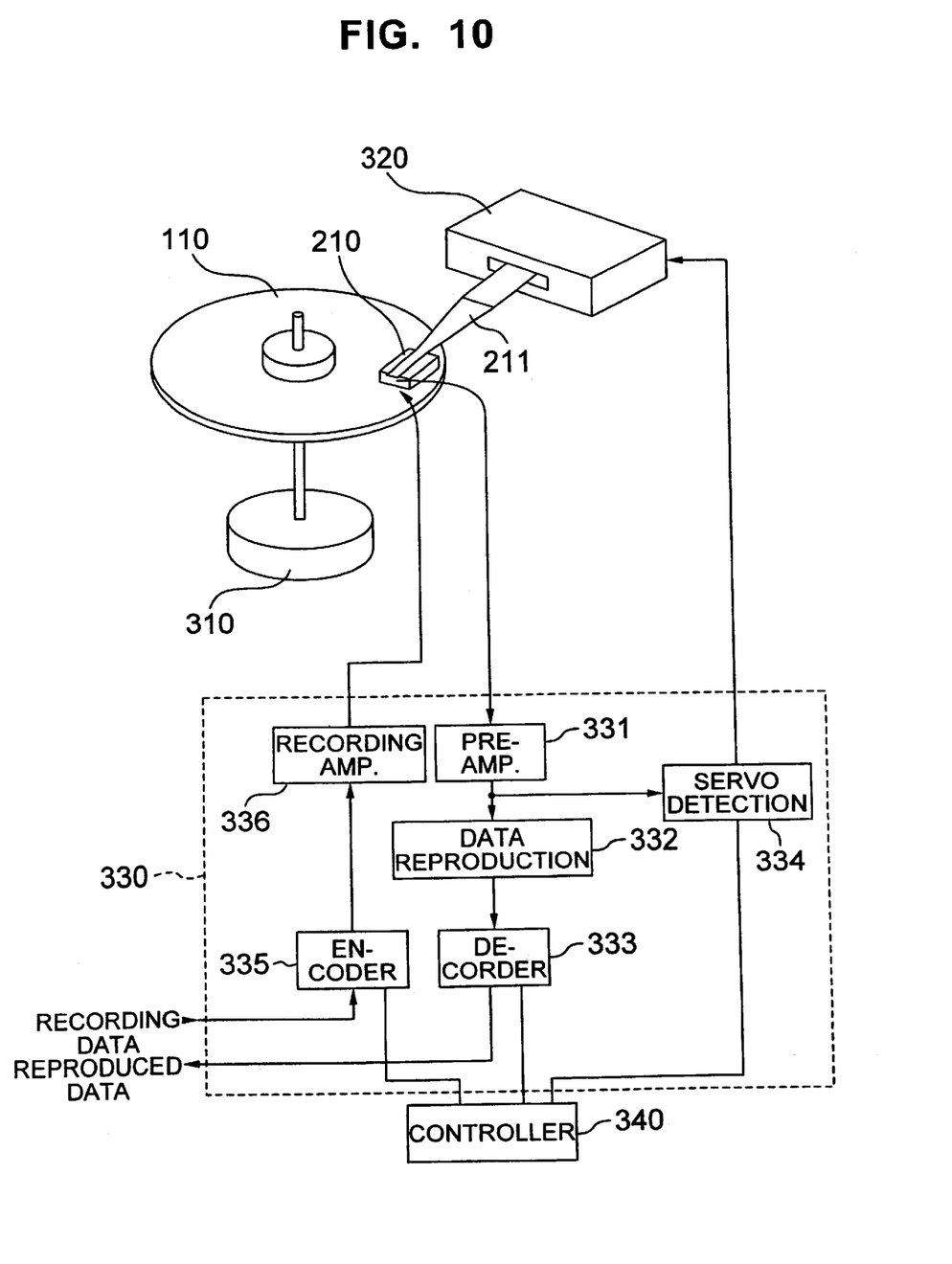
FIG. 10 is a perspective view showing a magnetic recording/reproducing apparatus using the magnetic head according to the embodiments of the present invention.

The magnetic recording/reproducing apparatus shown in FIG. 10 is equipped with the TMR head having any of the constructions of the embodiments of the present invention shown in FIGS. 2 to 9 as the reproducing head of the recording reproducing apparatus. Since this TMR head can prevent the leak of the current to the magnetic domain control film 7, the signal processing system 330 can detect with high efficiency the resistance change ratio due to the spin tunnel magneto-resistance effect, and a magnetic recording/reproducing apparatus having a high detection sensitivity at the time of reproduction can be obtained. Since the width of the electrode film 5 which is in contact with the magneto-resistance effect film 20 is reduced in this TMR head, the track width is small and the magnetic information of the recording medium 110 recorded in a high recording density can be reproduced.

In this way, the embodiments of the present invention can provide the construction of the recording/reproducing head using the spin tunnel magneto-resistance effect which head can prevent the leakage current and moreover has a small track width and high practicality, and the magnetic recording/reproducing apparatus using the recording/ reproducing head.

Next, an embodiment wherein the magnetic sensor according to the present invention is applied to a magnetic memory will be explained.

Figure 13:
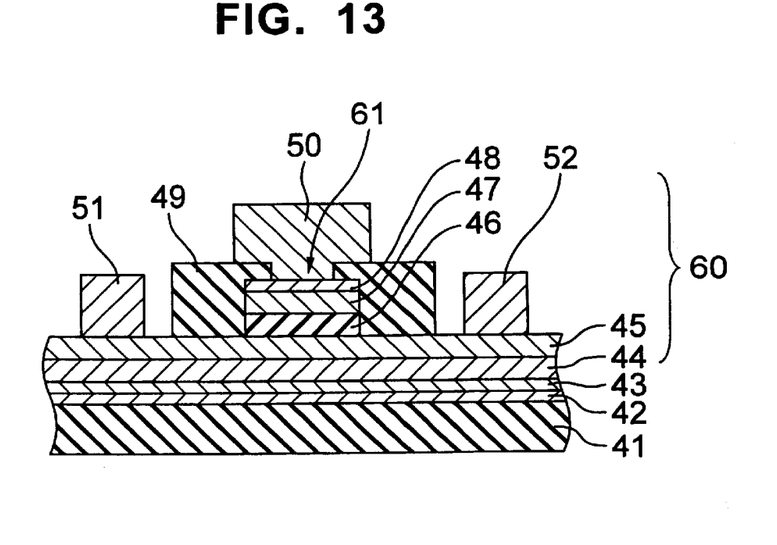
FIG. 13 is a sectional view showing a magnetic memory according to one embodiment of the present invention.
Figure 14:
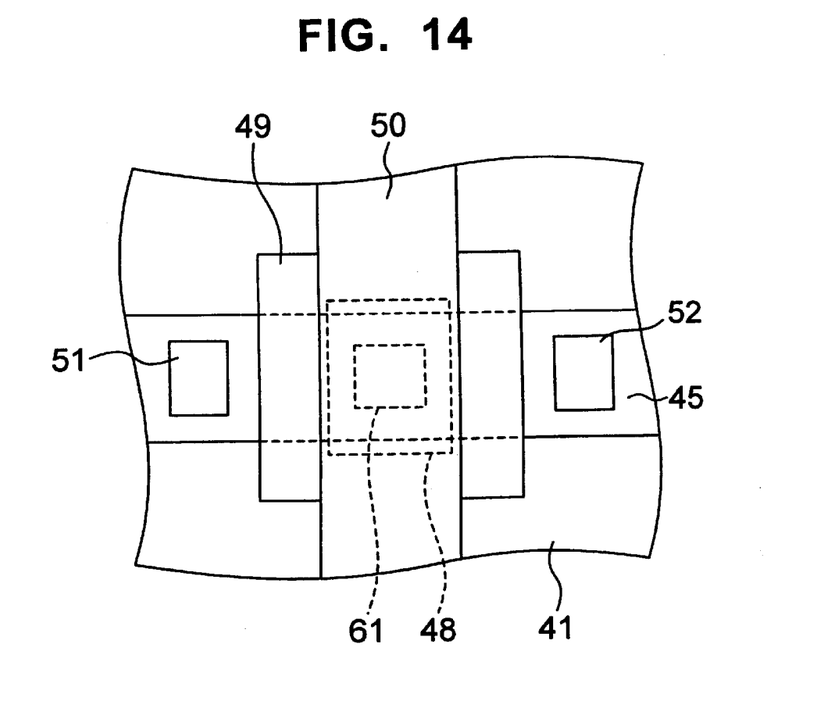
FIG. 14 is a plan view showing the magnetic memory according to one embodiment of the present invention.

FIG. 13 is a sectional view showing a magnetic memory according to this embodiment and FIG. 14 is a plan view showing the magnetic memory according to this embodiment. A first base layer 42, a second base layer 43, an anti-ferromagnetic layer 44 and a fixing layer 45 are formed by sputtering, or the like, on a substrate 41. These layers are etched into a first pattern extending in a first direction. Next, an insulating layer 46, a free layer 47 and a third base layer 48 are formed by sputtering, or the like. These layers are etched into a second pattern. The anti-ferromagnetic layer 44, the fixing layer 45, the insulating film 46 and the free layer 47 together constitute a magneto-resistance effect film 60 in a region where the first pattern and the second pattern cross each other. Next, an insulating film 49 is formed and patterned around the crossing region of the first and second patterns, and an opening 61 is formed at a substantial center of the insulating film 49. An upper electrode 50 is formed on the insulating film 49 inclusive of the inside of the opening 61. The upper electrode 50 defines a third pattern extending in a second direction crossing orthogonally the first direction and is electrically connected to the free layer 47 through the third base layer 48 only inside the opening 61 of the insulating film 49. Further, a first lower electrode 51 and a second lower electrode 52 are formed and patterned on a predetermined region of the fixing layer 45.

When a current is caused to flow between the first and second lower electrodes in the construction described above, the current flows through at least the fixing layer 45, and the direction of magnetization of the free layer 47 is determined by the flowing direction of the current, so that the data is stored. The magnetic characteristics of the anti-ferromagnetic layer 44 for fixing magnetization of the fixing layer 45 are decided so that the direction of magnetization of the free layer 47 is parallel or anti-parallel to the direction of magnetization of the fixing layer 45. When the current is caused to flow in the direction of film thickness of the magneto-resistance effect film 60 by applying a voltage between the upper electrode 50 and the first lower electrode 51 or between the upper electrode 50 and the second lower electrode 52, the current flows while tunneling through the insulating film 46, and the electric resistance of the magneto-resistance effect film 60 changes depending on whether the directions of magnetization of the free layer 47 and the fixing layer 45 are parallel or anti-parallel to each other, due to the spin tunnel magneto-resistance effect (TMR). The data that is stored can be read out by detecting this change. Though this embodiment uses a RAM (Random Access Memory) construction capable of writing the data, a ROM (Read-Only Memory) construction can be employed, too, by omitting the second lower electrode 52. When the ROM construction is employed, the data may be stored in advance by applying the magnetic field from outside.

Next, the material of each part will be explained. Silicon or ceramics, for example, can be used for the substrate 41. Tantalum (Ta), for example, can be used for the first base layer 42 and the third base layer 48. A NiFe alloy, for example, can be used for the second base layer 43. A FeMn alloy or a MnIr alloy, for example, can be used for the anti-ferromagnetic layer 44. A CoFe alloy, for example, can be used for the fixing layer 45. $Al_2O_3$, for example, can be used for the insulating films 46 and 49. A CoFe alloy or a NiFe alloy, for example, can be used for the free layer 47. Gold (Au), copper (Cu), tantalum (Ta), ruthenium (Ru), etc, for example, can be used for the upper electrode 50, the first lower electrode 51 and the second lower electrode 52. In addition, those materials which are described as usable for respective portions in the description of the foregoing embodiments of the magnetic heads may be employed, as well.

As described above, this embodiment provides the magnetic memory which can be produced more easily than the conventional processes and which can keep stably and satisfactorily film quality and film thickness of each layer.

What is claimed is:

1. A method of producing a spin tunnel magneto-resistance effect type magnetic sensor between a first electrode and a second electrode comprising:

forming the first electrode, forming a magneto-resistance effect film by depositing, in order, a free layer on the first electrode, a insulating layer on the free layer, a fixing layer on the insulating layer, and a anti-ferromagnetic film on said fixing layer, processing a width of said magneto-resistance effect film with respect to the perpendicular direction of said deposited layers to predetermine value by removing material from both sides of said magneto-resistance effect film, forming a resist on the top of said magneto-resistance effect film, forming a magnetic domain control film within a thickness less than the height of the bottom surface of said fixing film with respect to said first electrode, on said first electrode and on the resist, lifting off the magnetic domain control film formed above the magneto-resistance effect film by removing the resist, forming a insulation film on the top of magneto-resistance effect film from which the magnetic domain control film was lifted off, processing a through-hole to the anti-ferromagnetic film in the insulation film, forming the second electrode on the insulating film.

* * * * *